United States Patent [19]
Kwon et al.

[11] Patent Number: 5,552,337
[45] Date of Patent: Sep. 3, 1996

[54] METHOD FOR MANFACTURING A CAPACITOR FOR A SEMICONDUCTOR MEMORY DEVICE HAVING A TAUTALUM OXIDE FILM

[75] Inventors: Kee-won Kwon, Suwon; Chang-seok Kang, Seoul, both of Rep. of Korea

[73] Assignee: Samsung Electronics Co., Ltd., Suwon, Rep. of Korea

[21] Appl. No.: 301,437

[22] Filed: Sep. 9, 1994

Related U.S. Application Data

[62] Division of Ser. No. 103,059, Aug. 9, 1993, abandoned.

[30] Foreign Application Priority Data

Aug. 7, 1992 [KR] Rep. of Korea ................. 1992/14195

[51] Int. Cl.⁶ .......................... H01L 21/70; H01L 27/00
[52] U.S. Cl. .................. 437/60; 437/235; 437/240; 437/919
[58] Field of Search ........................ 437/52, 60, 919, 437/235, 240; 148/DIG. 14

[56] References Cited

U.S. PATENT DOCUMENTS

| | | | |
|---|---|---|---|
| 4,589,056 | 5/1986 | Stimmell | 361/311 |
| 4,734,340 | 3/1988 | Saito et al. | 428/698 |
| 4,868,619 | 9/1989 | Mukherjee et al. | 257/300 |
| 4,937,650 | 6/1990 | Shinriki et al. | 257/296 |

OTHER PUBLICATIONS

Shinriki et al. UV–$O_3$ and Dry–$O_2$ ; Two Steps annealed Chemical Vapor–Deposited $Ta_2O_5$ films For Storage dielectrics of 64–116.

Dram's, IEEE Transactions on electron devices, pp. 455–462, vol. 38. No. 3, Mar. 1991, Nishioka et al. Interface of $SiO_2$ at the $Ta_2O_5$/Si interface on dielectric characteristics of $Ta_2O_5$ capacitor, J. Appl. Phys 61(6) Mar. 15, 1987, pp. 2335–2338.

Zaima et al. Conduction Mechanism of Leakage Current in $Ta_2O_5$ Film on Si Prepared by LPCVD, pp. 2876–2879, Electro Chemical Soc. vol. 137 No. 3, Sep. 1990.

Primary Examiner—Olik Chaudhuri
Assistant Examiner—H. Jey Tsai
Attorney, Agent, or Firm—Cushman Darby & Cushman, L.L.P.

[57] ABSTRACT

A capacitor for a semiconductor memory device employs a tantalum pentoxide film as a dielectric film. The dielectric film is made from tantalum pentoxide film doped with silicon over a first electrode. A second electrode is then formed over the dielectric film. Accordingly, in the method for manufacturing the device, although the dielectric constant of the dielectric film is somewhat lower than the conventional pure tantalum pentoxide film due to the silicon doped within the tantalum pentoxide film, leakage current is reduced and breakdown voltage is increased. Therefore, the dielectric film according to the present invention exhibits excellent electrical characteristics and high reliability.

10 Claims, 7 Drawing Sheets

FIG.6A
BEFORE ANNEALING
FIG.6B
AFTER ANNEALING
350 °C 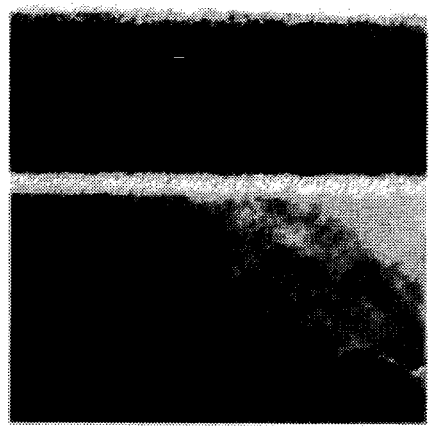 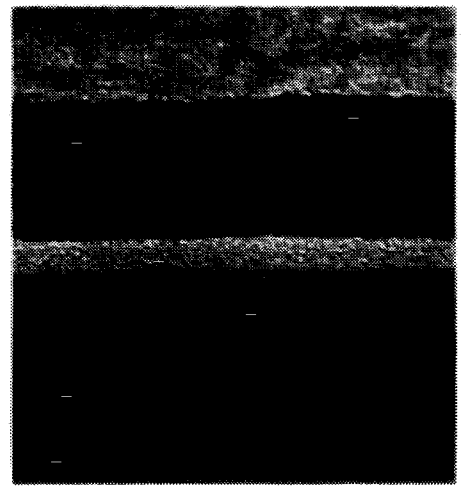 350 °C
430 °C 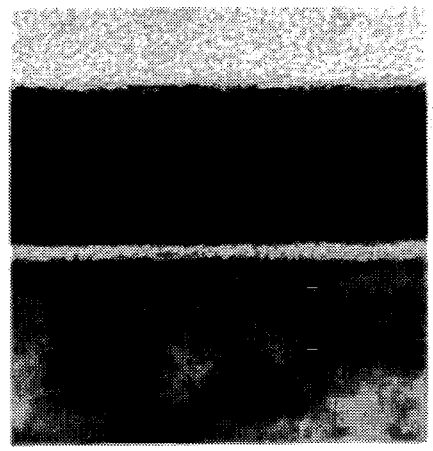 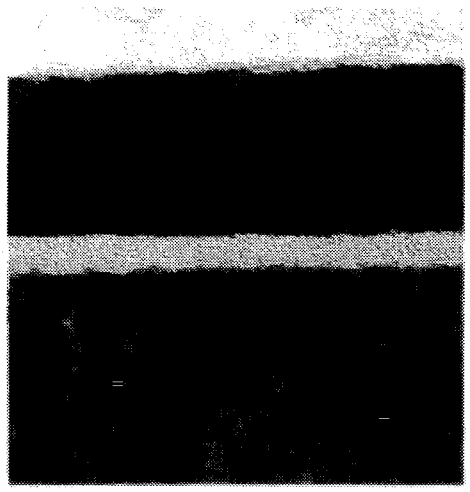 430 °C
BEFORE ANNEALING
AFTER ANNEALING
FIG.6C
FIG.6D

METHOD FOR MANFACTURING A CAPACITOR FOR A SEMICONDUCTOR MEMORY DEVICE HAVING A TAUTALUM OXIDE FILM

This is a division of application Ser. No. 08/103,059, filed on Aug. 9, 1993, which was abandoned.

BACKGROUND OF THE INVENTION

The present invention relates to a semiconductor memory device and manufacturing method, and more particularly to a semiconductor memory device that has a tantalum pentoxide layer as a capacitor dielectric film and a method for manufacturing the same.

As semiconductor manufacturing technology has progressed and the applications of memory devices has expanded, highly integrated memory devices have been developed. One type of memory device, a dynamic random access memory (DRAM) cell, consists of a single capacitor and a single transistor and is capable of being made using large-scale integration techniques.

DRAM integration has developed by a factor of four during the last three years. 4 Mb DRAM chips are currently in mass-production, the 16 Mb DRAM is quickly being developed for mass-production, and both 64 Mb and 256 Mb DRAMs are being researched and developed.

It is crucial that these new generation semiconductor memory devices have sufficiently large capacitances in which to read and write information. However, as integration density increases, it is increasingly difficult to obtain sufficient cell capacitance as the size of each memory cell must be reduced in order to accommodate more memory cells per unit area. Accordingly, methods have been sought to achieve larger capacitances within limited areas. These methods are: (1) reducing the thickness of the dielectric film, (2) increasing of the effective area of the capacitor, and (3) using materials having a large dielectric constant.

With respect to the third method of using materials having a large dielectric content, it is necessary to use a very strong dielectric material as the capacitor's dielectric film to ensure good dielectric properties. Various oxides, e.g., tantalum pentoxide ($Ta_2O_5$), yttrium oxide ($Y_2O_3$), hafnium oxide ($HfO_2$), etc. have been suggested, with tantalum pentoxide being widely considered the most preferred dielectric material due to its high dielectric constant and thermodynamic stability.

Tantalum pentoxide has a dielectric constant of about 22-25 for a thin film, and can be applied using chemical vapor deposition (CVD). As for the CVD methods, many variations have been suggested, e.g., a low-pressure chemical vapor deposition (LPCVD), a plasma-enhanced chemical vapor deposition (PECVD), a photo chemical vapor deposition (photo-CVD), etc. of these, tantalum pentoxide film formed by the PECVD method has a densely formed film composition, and results in a carbon-free film. Thus, a tantalum pentoxide film made by the PECVD method has very good electrical characteristics in comparison to such a film made using the LPCVD method.

Tantalum pentoxide films formed by the LPCVD method, though it has drawbacks of high leakage current and a low breakdown voltage, has still been widely used for three-dimensional memory cell structures having a large aspect ratio because this method exhibits good step coverage and is suitable for mass-production.

U.S. Pat. No. 4,734,340 describes a method attempting to solve the problems related above in which titanium (Ti) or titanium oxide ($TiO_2$) is doped into the tantalum pentoxide film to improve its electrical characteristics. Manufacturing equipment is required to simultaneously supply both the raw materials of tantalum and titanium, in order to simultaneously deposit these materials to form a tantalum pentoxide film doped with titanium. Tantalum penta-ethoxide ($Ta(OC_2H_5)_5$) is used as the tantalum material and a titanium tetra-isoproxide ($Ti(iso-OC_3H_7)_4$) is used as the titanium material. Significant improvements are most noticeable when 1.8 wt. % of titanium, based on the amount of the tantalum, is added. When the titanium was thus doped, the leakage currents of about $5\ 10^{-9} A/cm^2$ in an electrical field of 1 MV/cm, were obtained. Overall this method shows consistently excellent characteristics without any electrode-dependency.

However, in order to use the method suggested by U.S. Pat. No. 4,734,340 new apparatus for supplying the titanium, in addition to the conventional equipment is required. Moreover, tightly controlling the titanium concentration (from about 1.5 to 2.5 wt. % based on the amount of the tantalum) is very difficult. Further, the process becomes significantly difficult to accomplish as the number of components increase in ordinary chemical vapor deposition methods. Additionally, the titanium oxide has a low work function of electrons, so that if a titanium oxide forms condensates in the tantalum pentoxide film, the leakage current increases along the precipitates of the titanium oxide, which deteriorates the electrical characteristics.

SUMMARY OF THE INVENTION

Therefore, the object of the present invention, is to provide a capacitor comprising a tantalum pentoxide film in which an additive is doped, thereby decreasing leakage current.

The other object of the present invention is to provide an effective method for manufacturing a capacitor having a tantalum pentoxide film, in which an additive is doped to reduce leakage current.

Another object of the present invention is to provide a method of manufacturing a capacitor which requires no additional manufacturing apparatus.

To accomplish the aforementioned first object of the present invention, the present invention provides a semiconductor memory device having a capacitor wherein a dielectric film composed of tantalum pentoxide doped with silicon therein is formed on a first electrode formed on the semiconductor substrate and a second electrode is formed on the dielectric film.

Also, for accomplishing the aforementioned second and third objects, the present invention provides a method for manufacturing a semiconductor memory device having a capacitor, which comprises the steps of forming a first electrode on a semiconductor substrate; forming on the first electrode a dielectric film made by doping silicon into the tantalum pentoxide film; and forming a second electrode on the dielectric film.

The silicon doped to the tantalum pentoxide film used as the dielectric film of a capacitor exists as a silicon atom or silicon oxide. Also, the doping of the silicon reduces leakage current in the dielectric film and increases the breakdown voltage.

BRIEF DESCRIPTION OF THE DRAWINGS

The above objects and other advantages of the present invention will become more apparent by describing in detail a preferred embodiment of the present invention with reference to the attached drawings in which:

FIGS. 6A–6D consist of TEM photographs showing the thickness of the tantalum pentoxide films of FIG. 5;

DESCRIPTION OF THE PREFERRED EMBODIMENTS

The present invention will be described in more detail, hereinbelow, in reference with the attached drawings.

Figure 1:
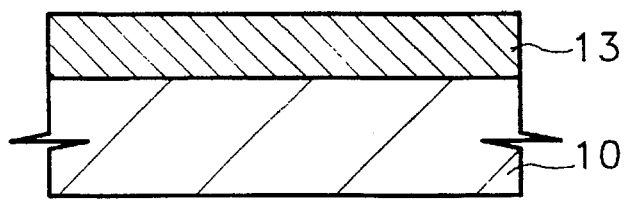
FIGS. 1 and 2 are sectional views of a semiconductor device having a tantalum pentoxide film according to the present invention.

FIG. 1 illustrates a step of forming a first conductive layer 13 with, for example, a polysilicon layer doped with an impurity, formed on semiconductor substrate 10. First conductive layer 13 is used as the first electrode of a capacitor. Besides polysilicon doped with an impurity, any silicon-series conductive layer is acceptable for use as the first conductive layer.

Figure 2:
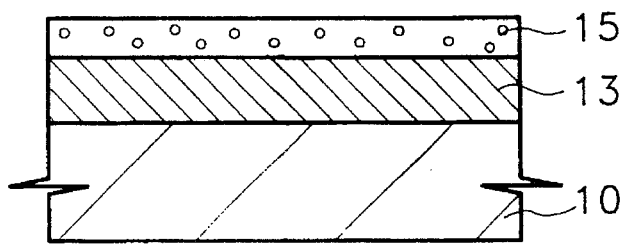

FIG. 2 shows the step of forming a tantalum pentoxide dielectric film 15, on first conductive layer 13. The tantalum pentoxide film is initially formed as a porous film by means of the LPCVD method at a low temperature (below 410° C.). Thereafter, a heat-treatment process is performed in an oxygen atmosphere, so that the silicon of the conductive layer 13 diffuses into the porous tantalum pentoxide film. Thus a tantalum pentoxide film 15 doped with silicon is formed, i.e., a dielectric film is formed. It should be noted that a one-time deposition thickness of the aforementioned silicon oxide layer should be maintained within 20 Å, in order to sufficiently diffuse the silicon atoms of a silicon oxide layer into the tantalum pentoxide film in the subsequent heat treatment process.

Although the dielectric constant is somewhat less than the dielectric constant obtained with tantalum pentoxide formed with prior art LPCVD methods, significant improvements with respect to the leakage current and breakdown voltage can be achieved.

In the subsequent processes, a conductive layer (not shown) which is used as the second electrode of a capacitor is formed on dielectric film 15, and thus the capacitor is completed.

Doping the silicon with the tantalum pentoxide film has been found advantageous. It has also been determined that there are different methods in which to dope the silicon, which include: (1) the above described method, i.e., diffusing the silicon into the porous tantalum pentoxide film, (2) by simultaneously implanting silicon raw material and tantalum raw material, or (3) by alternately depositing the tantalum pentoxide film and silicon dioxide film as thin films and then interactively diffusing the silicon by heat-treatment. Other such methods for doping the silicon with tantalum pentoxide exist.

It is preferred to use tetra-ethyl-ortho-silicate (TEOS: $Si(OC_2H_6)_4$) as the silicon raw material, and tantalum penta-ethoxide ($Ta(OC_2H_5)_5$) the tantalum raw material. Moreover, the heat-treatment which is performed after forming the porous tantalum pentoxide film should be preferably performed at high temperature of about 650° C.–1,000° C., and carried out in an oxygen atmosphere, in a nitrogen atmosphere, in a vacuum atmosphere of about 100–1,000 mTorr, or a combination or sequence of these atmospheres. After the diffusion is complete, replacement occurs of 3–30 wt. % of the whole amount of tantalum atoms.

When depositing the tantalum pentoxide film, deposition can be achieved by flowing oxygen ($O_2$) and tantalum penta-ethoxide. Tantalum, tantalum pentoxide, etc., can be separated from the tantalum penta-ethoxide, but in general the tantalum penta-ethoxide is known as a source of tantalum and the oxygen as an oxidant. Therefore, TEOS is denoted as a source of silicon.

Generally, the process of manufacturing a tantalum pentoxide layer is one of supplying the oxygen gas as an oxidant. Thus if TEOS is supplied, $SiO_2$ can be easily obtained. Here, the silicon within the tantalum pentoxide film exists theoretically in the form of $SiO_2$. However, since silicon is known to be separated from the TEOS, the silicon existing in the tantalum pentoxide film can exist as a pure silicon atom as well as in $SiO_2$, i.e., a silicon oxide.

When method 2, noted above, (wherein silicon raw material and tantalum raw material are simultaneously implanted) is used to flow TEOS as the silicon raw material, tantalum penta-ethoxide is used as the tantalum raw material and oxygen as the oxidant, simultaneously, to form a tantalum pentoxide film doped with silicon using a co-deposition process. However, in the actual LPCVD methods, co-deposition cannot take place even though the two materials flow in simultaneously. This is because the deposition of an oxide layer ($SiO_2$) using of TEOS and oxygen occurs at a temperature of 600°–850° C., while the deposition of tantalum pentoxide film using tantalum penta-ethoxide and the oxygen occurs at a temperature of 300°–600° C. Therefore, it would be desirable to co-deposit near 600° C. where the oxide layer and the tantalum pentoxide film form at the same time. However, at this temperature (600° C.), the deposition rate of the tantalum pentoxide film is so fast that it is not possible to control the growth rate of the thin film. Accordingly, when method 2 as described above is used, it is preferable that the deposition should be carried out according to the PECVD method, at about 400° C., using combinations of TEOS, tantalum penta-ethoxide and oxygen in a plasma atmosphere.

Figure 3:
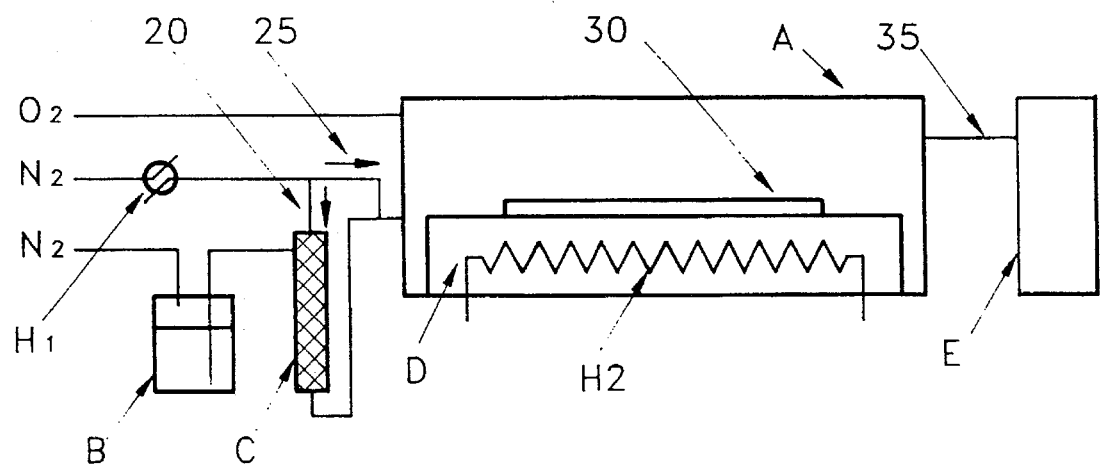
FIG. 3 is a chart showing the deposition apparatus used in the present invention.

FIG. 3 is a schematic diagram showing a deposition apparatus used in the present invention. A tantalum penta-ethoxide raw material is contained in a tank B and is loaded into a vaporizer C under 8 psi nitrogen ($N_2$) pressure. Thereafter, the tantalum penta-ethoxide is vaporized together with vaporizer nitrogen 20, which flows into vaporizer C. The vaporized mixture is then introduced into a reaction tube A. To prevent the tantalum raw material and vaporizer nitrogen 20 from condensing when introduced to reaction tube A, diluted nitrogen from line 25 is added to the vaporized mixture before being introduced. The nitrogen supplied along lines 20 and 25 is pre-heated to about 150° C. in a first heater H1. The vapor introduced into reaction tube A is deposited on the surface of a wafer 30 together with the oxygen ($O_2$) which is introduced separately. The wafer is located on a susceptor D which has been heated to 350°–490° C. by a second heater H2. Upon completion of the deposition processes, the remaining unreacted material and the reaction by-products are discharged through an exhaust 35 connected to a vacuum pump E, which regulates the pressure of reaction tube A between 400–600 mTorr.

Figure 4:
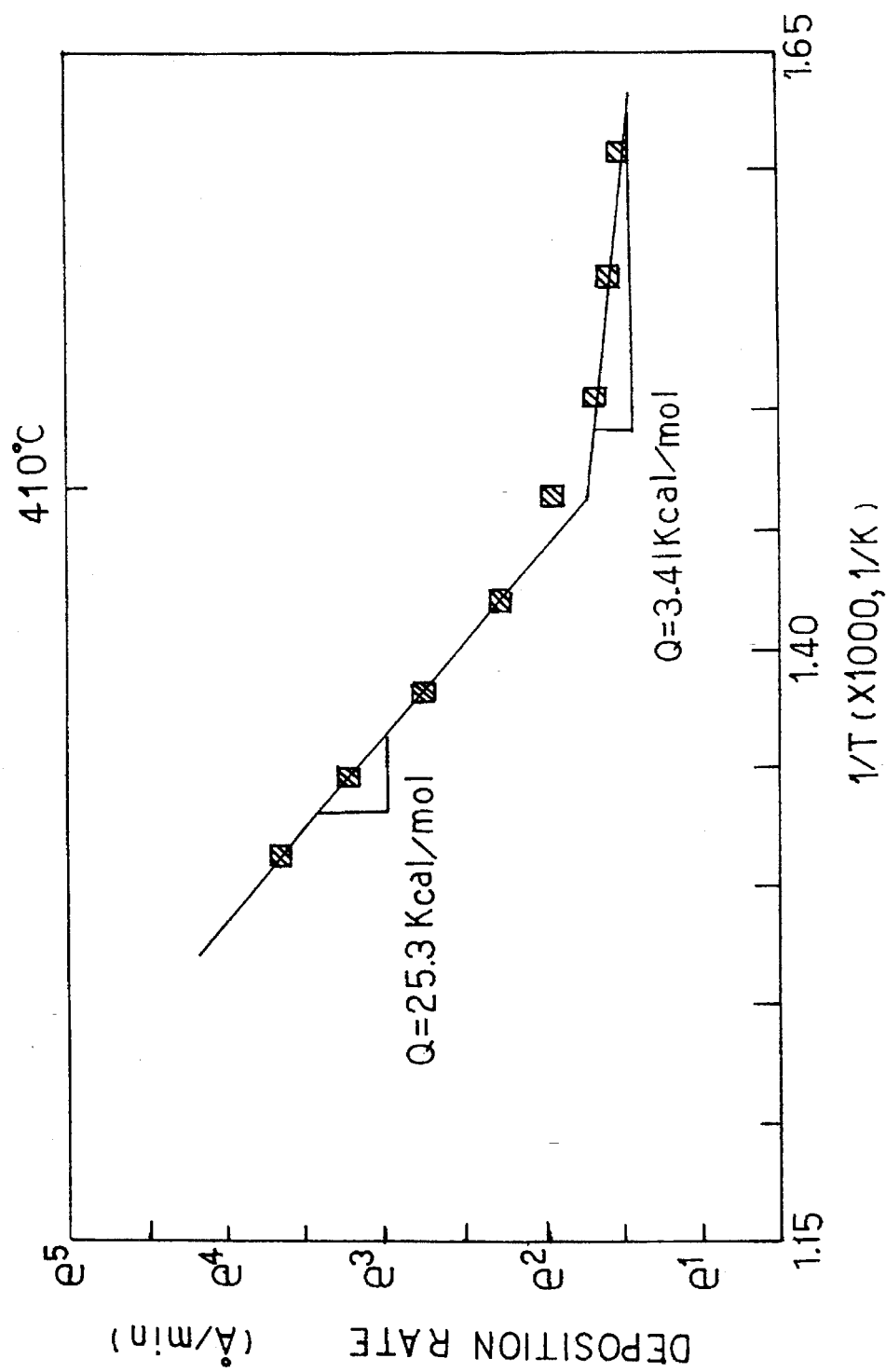
FIG. 4 is a chart showing the relationship between the deposition rate of a tantalum pentoxide film and the inverse of temperature, according to the present invention.

FIG. 4 is a chart showing the relationship between the logarithmic value of the deposition rate (in angstroms per minute) of a tantalum pentoxide film and the inverse of the temperature, in which the deposition rate with respect to temperature was observed. Here, the values according to the Arrhenius relationship are shown. It should be noted that, at 410° C., the slope changes drastically, the deposition rate being proportional to the activation energy (Q) of the deposition process. At a high temperature, the deposition process is controlled by the surface reaction of the radicals having the activation energy of 25.3 kcal per mole. At a low temperature, the film deposition is controlled by a different mechanism in which Q is 3.41 kcal per mole. The Arrhenius relationship (Equation 1) defines the temperature-accelerated reaction rate of thermally activated processes (e.g., diffusion, chemical reactions, etc.).

$$K = K_0 \exp\left(-\frac{Q}{RT}\right) \quad (1)$$

where K is a reaction rate (diffusion rate, reaction rate, deposition rate, etc.), $K_0$ is a constant (reaction rate at an infinitely high temperature), Q is an activation energy, T is an absolute temperature (K), and R is the gas constant (8.3144 J/mole K).

Equation 1 can be rewritten as $$\ln K = \ln K_0 - \left(\frac{Q}{R}\right)\left(\frac{1}{T}\right) \quad (2)$$

That is, as shown in Equation 2, the lnK is proportional to 1/T, and the slope of this equation is proportional to the activation energy. As can be seen from the chart in FIG. 4, the deposition rate and the 1/T curve, results in linear relationships such that the deposition rate is controlled by a single variable, which variable is the activation energy. Linearity occurs above and below 410° C. as shown in FIG. 4. Thus, in the temperature range below 410° C., one deposition rate exists, and another deposition rate exists above 410° C.

Figure 5:
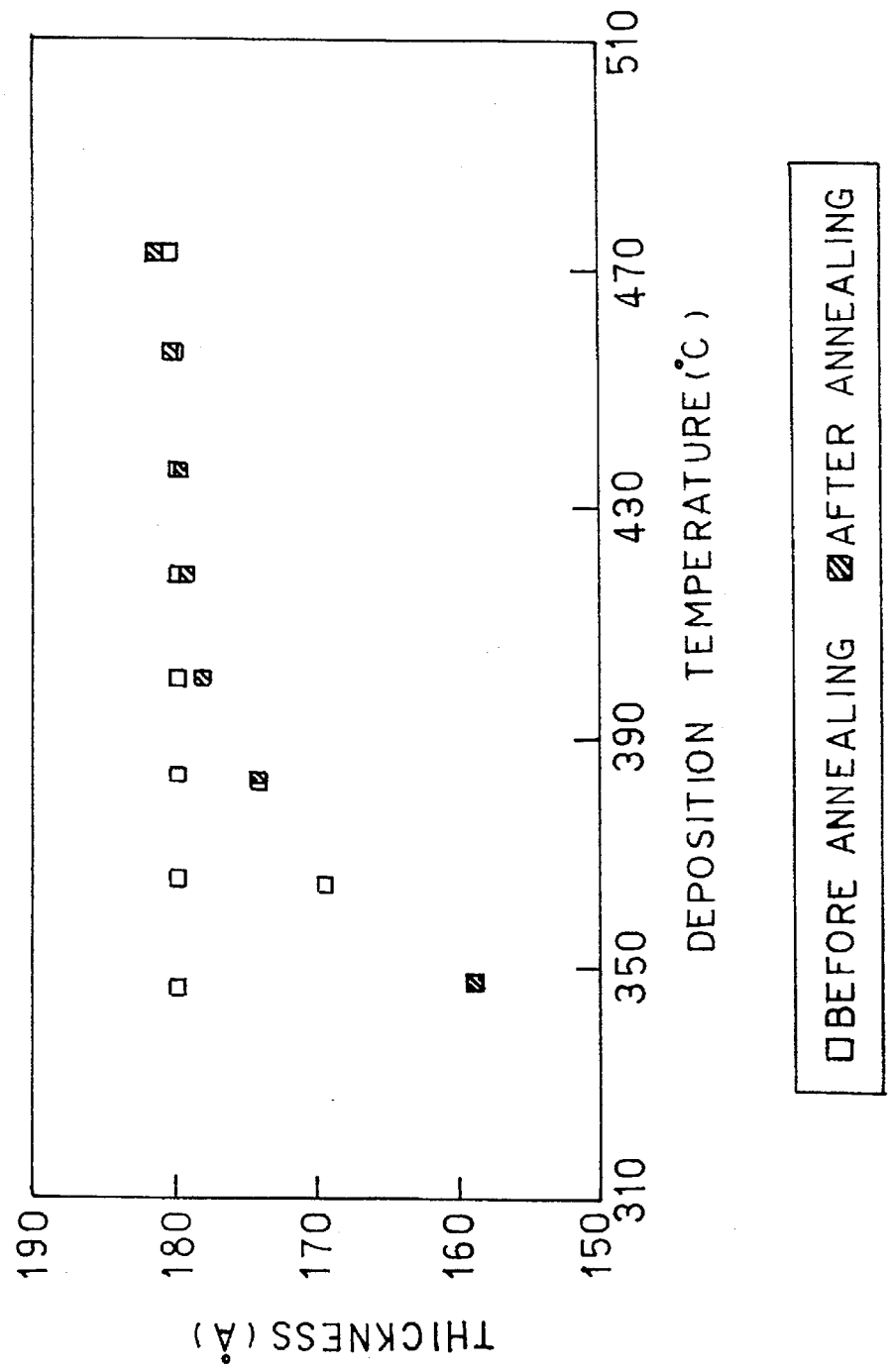
FIG. 5 is a chart showing the relationship between the deposition temperature and the film thickness, before and after the heat-treatment of the tantalum pentoxide film, according to the present invention.

FIG. 5 is a chart illustrating the relationship between the deposition temperature and the film thickness change of the tantalum pentoxide film according to the present invention before and after the heat-treatment. The thickness was measured using an ellipsometer and is shown for both cases (before and after heat-treatment, at 800° C. and in an oxygen atmosphere). As illustrated, the lower the temperature at which tantalum pentoxide film is deposited, the thinner the thickness of the film upon the completion of the heat-treatment. The measured thickness of the tantalum pentoxide film A was verifiably reduced, as shown in the transmission electron microscopy (TEM) photographs of FIG. 6.

Figure 7:
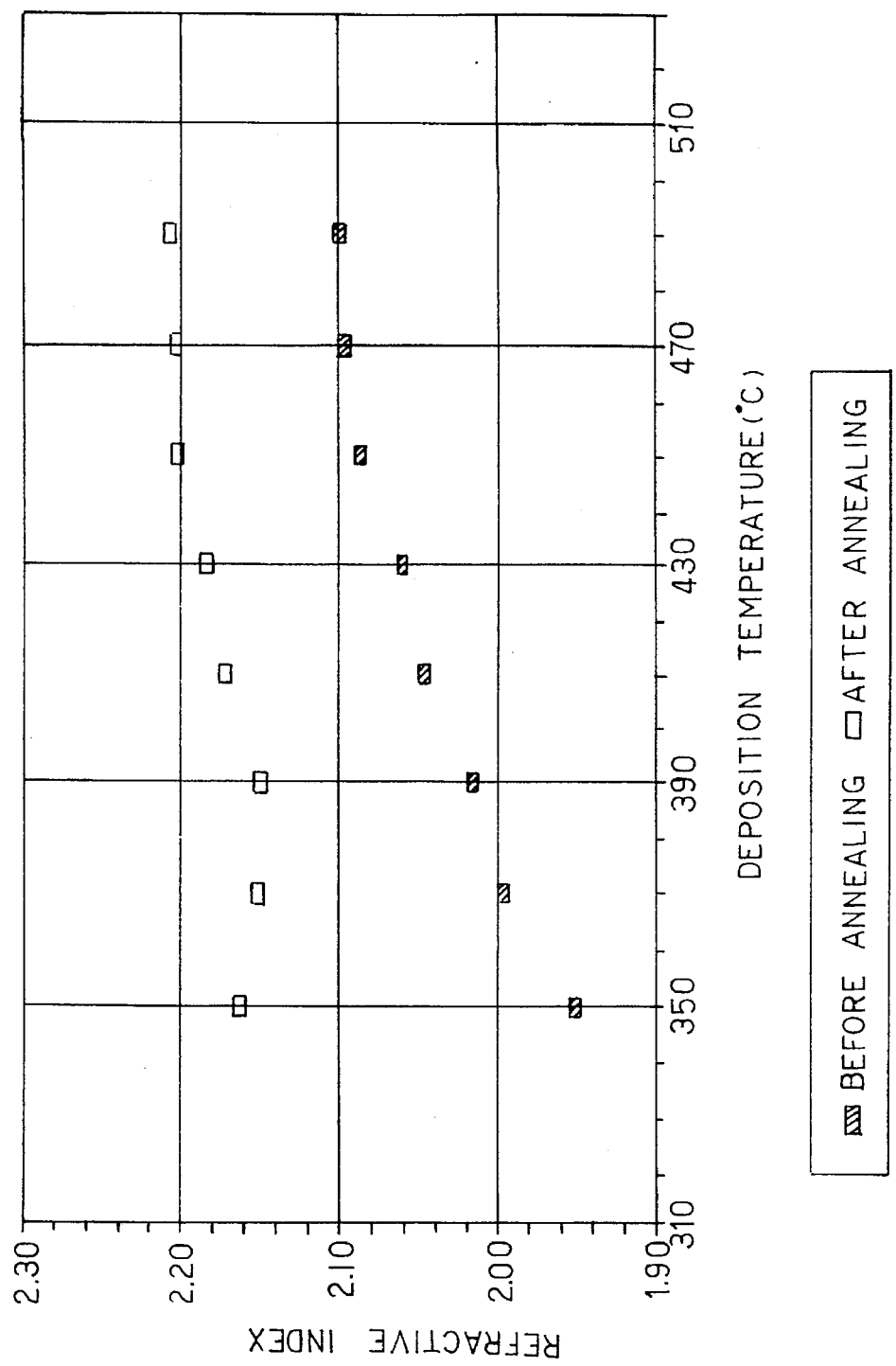
FIG. 7 is a chart showing the relationship between the deposition temperature of the tantalum pentoxide film and the refractive index, according to the present invention.

FIG. 7 is a chart illustrating the relationship between the deposition temperature of a tantalum pentoxide film and the refractive index according to the present invention. As illustrated, the refractive index prior to annealing is proportional to the film density. The tantalum pentoxide film deposited at a low temperature shows a lower refractive index. However, upon the completion of the heat-treatment (800° C. for 30 minutes in an oxygen atmosphere) the film's refractive index becomes substantially constant, especially at higher temperatures, regardless of the film's deposition temperature. Therefore, it should be noted that at a low deposition temperature a less dense tantalum pentoxide film was deposited than that for high-temperature film formation, but that the subsequent heat-treatment step greatly increased the film's density regardless of the deposition temperature.

Figure 8:
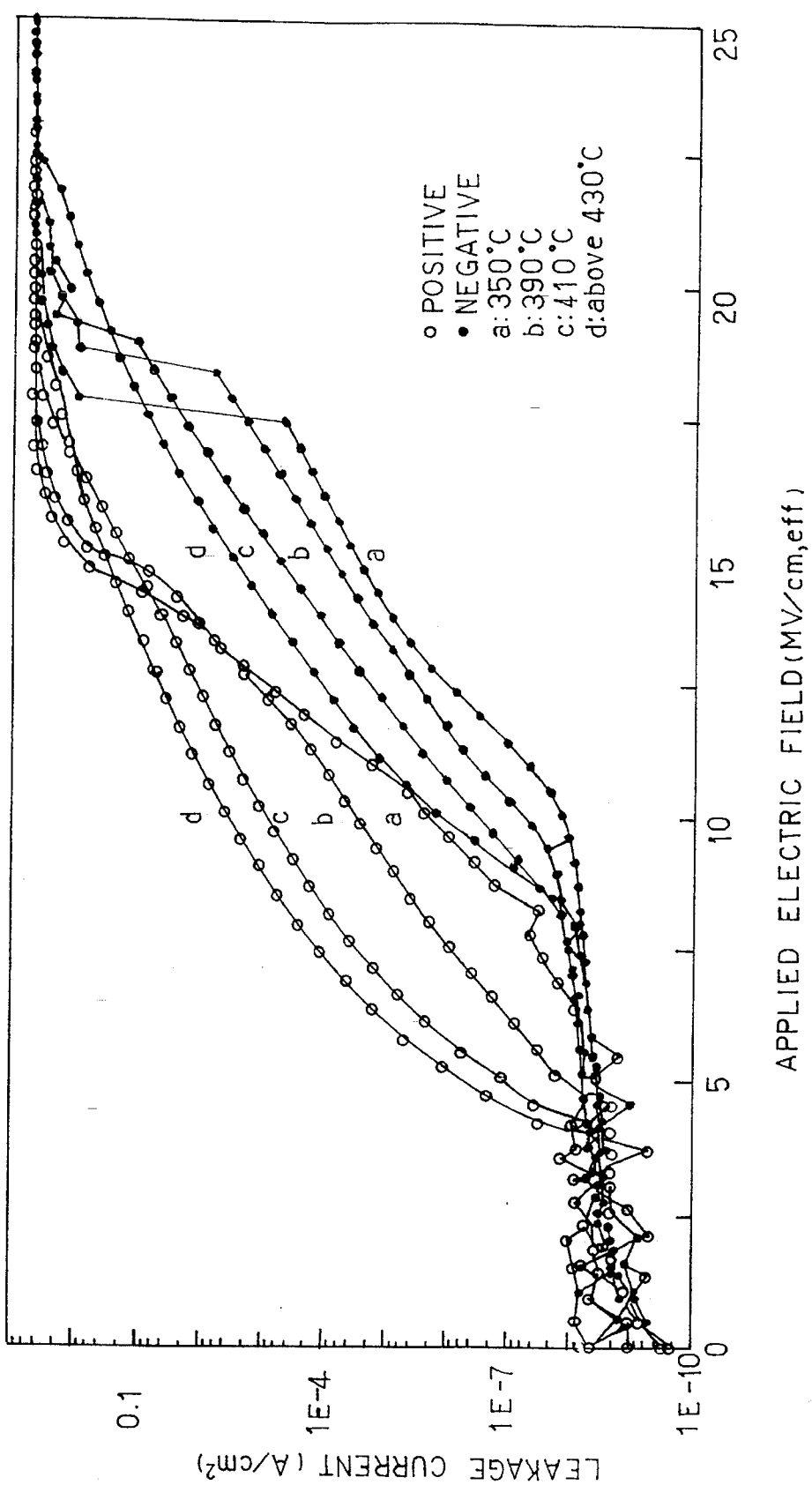
FIG. 8 is a chart showing the relationship between the leakage current and the applied electric field, when heat-treating tantalum pentoxide films deposited at different temperatures under an oxygen atmosphere and then forming a capacitor.
Figure 9:
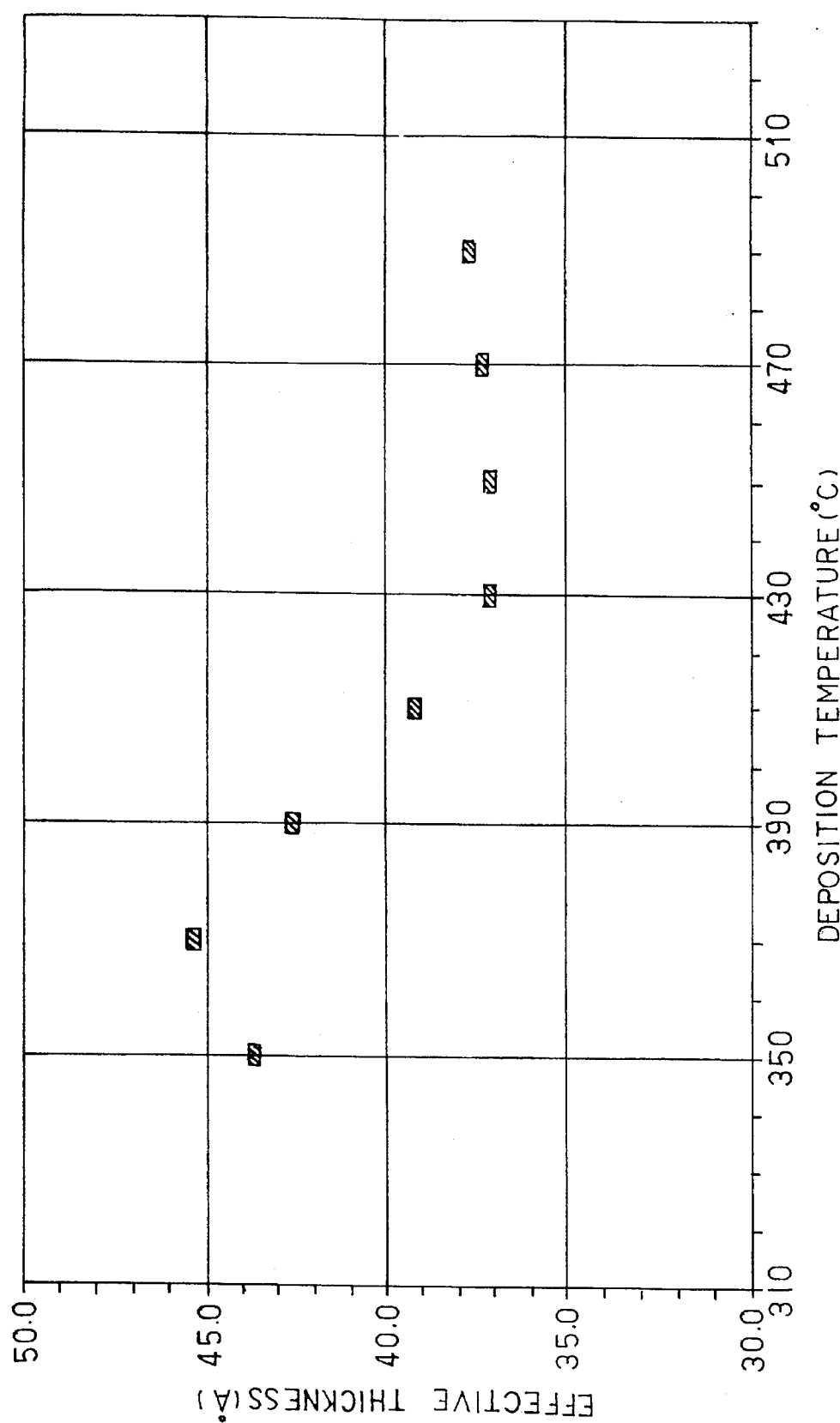
FIG. 9 is a chart showing the relationship between the effective thickness, and the deposition temperature according to the present invention.

FIG. 8 is a chart showing the relationship between the leakage current and the applied electric field in capacitors formed according to the present invention, but each formed using a tantalum pentoxide deposition having a different temperature. As shown, the film deposited at temperatures of 430° C. or higher (curve "d") shows a nearly constant leakage current, but the films deposited at temperatures below 410° C. (curves "a", "b" and "c") show substantially reduced leakage current and increased breakdown voltage. Importantly, all capacitors having a tantalum pentoxide film have a "take-off" point (the point at which the leakage current starts to increase drastically). When the applied voltage caused an electric field below the take-off point, even a small change in the voltage may cause a large change in the leakage current, which therefore adversely affects the reliability of the film. Accordingly, it should be noted that the take-off point is a significantly higher value for the 350° C. deposition film, as shown in FIG. 8, and therefore the film reliability can be significantly improved when a lower deposition temperature is used.

As shown in FIGS. 5 and 6, the thickness of the tantalum pentoxide film deposited at a low temperature becomes thinner upon the completion of the heat-treatment, and the intermediate oxide layer B having a low dielectric constant (the white portion in the middle of the TEM photographs of FIG. 6) between the lower electrode C (the black portion of the lower section of the TEM photographs) and the tantalum pentoxide film C (the black portion of the upper section, as a first dielectric film) remains constant regardless of the deposition temperature.

Table 1 shows the atomic content of silicon and carbon as a fraction of the tantalum atoms within the tantalum pentoxide film before and after heat-treating in an oxygen atmosphere, the tantalum pentoxide layer deposited at low and high temperatures. The measurements provided were obtained by X-ray photoelectron spectroscopy.

TABLE 1

| deposition temperature | silicon | | carbon | |
| --- | --- | --- | --- | --- |
|  | 350° C. | 490° C. | 350° C. | 490° C. |
| before annealing | 0.070 | 0.048 | 0.041 | 0.039 |
| after annealing | 0.096 | 0.059 | 0.028 | 0.039 |

A tantalum pentoxide film showing good electrical characteristics and having the lowest carbon-content and the highest silicon-content were obtained when low-temperature deposition was used. The electrical characteristics of the low-temperature deposition layer are excellent due to the fact that not only is the carbon content reduced within the film, but also a large quantity of silicon having a smaller valence as compared to that of tantalum (the valence of tantalum being five and that of silicon being four) is introduced into the film, thereby reducing the number of the oxygen's vacant holes (lattice point) which function as the carrier-bodies of the film's leakage current. As indicated in Table 1, the carbon content of each test film was relatively constant before the heat-treatment.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method for manufacturing a capacitor for a semiconductor memory comprising the steps of:
   depositing a first conductive layer doped with silicon on a semiconductor substrate;
   depositing a porous tantalum pentoxide film on said first conductive layer using a low pressure chemical vapor deposition process;
   heating said porous tantalum pentoxide film on said first conductive layer to cause a diffusion of silicon atoms from said first conductive layer doped with silicon into said porous tantalum pentoxide film; and
   forming a second conductive layer on said porous tantalum pentoxide film.

2. The method for manufacturing a capacitor for a semiconductor memory device according to claim 1, wherein;
   said step of depositing said porous tantalum pentoxide film includes use of tantalum penta-ethoxide as a tantalum raw material and oxygen as a reaction gas; and
   said low pressure chemical vapor deposition process is performed at a temperature below 410° C.

3. The method for manufacturing a capacitor for a semiconductor memory device according to claim 1, wherein said step of heating said porous tantalum pentoxide film is performed at a temperature between 650°–1,000° C. and a pressure between 100–1,000 mTorr in one of an oxygen atmosphere, a nitrogen atmosphere, and a combination oxygen-nitrogen atmosphere.

4. The method for manufacturing a capacitor for a semiconductor memory device according to claim 1, wherein said step of heating said porous tantalum pentoxide film causes diffusion of silicon atoms into said porous tantalum pentoxide film such that an amount of said silicon atoms within said tantalum pentoxide film is 3–30 wt. % of a whole amount of tantalum atoms in said porous tantalum pentoxide film.

5. The method for manufacturing a capacitor for a semiconductor memory device according to claim 1, further comprising a step of simultaneously depositing a silicon raw material together with a tantalum raw material used in depositing said porous tantalum pentoxide film on said first conductive layer.

6. A method for manufacturing a capacitor for a semiconductor memory device comprising steps of:
   forming a first electrode on a semiconductor substrate;
   simultaneously depositing on said first electrode TEOS used as a silicon raw material together with tantalum penta-ethoxide used as a tantalum raw material to form a dielectric tantalum pentoxide film; and
   forming a second electrode on said dielectric tantalum pentoxide film.

7. The method for manufacturing a capacitor for a semiconductor memory device according to claim 1, wherein said step of depositing said first conductive layer doped with silicon includes steps of:
   depositing alternate layers of tantalum pentoxide and silicon oxide; and then
   performing an interactive diffusion with respect to said layers of tantalum pentoxide and silicon oxide by heat-treatment.

8. A method for manufacturing a capacitor for a semiconductor memory device comprising steps of:
   forming a first electrode on a semiconductor substrate by steps of:
      depositing alternate films of tantalum pentoxide and silicon oxide using TEOS as a raw material for silicon and using tantalum penta-ethoxide as a raw material for tantalum, and then
      performing an interactive diffusion with respect to said films of tantalum pentoxide and silicon oxide by heat-treatment;
   depositing a tantalum pentoxide film, to thereby form a dielectric film; and
   forming a second electrode on said dielectric film.

9. The method for manufacturing a capacitor for a semiconductor memory device according to claim 7, wherein said heat-treatment is performed by one or more high-temperature process from among;
   heat-treatment in an oxygen atmosphere,
   heat-treatment in a nitrogen atmosphere, and
   heat-treatment in a 100–1,000 mTorr vacuum atmosphere, at a temperature of 650°–1,000° C.

10. The method for manufacturing a capacitor for a semiconductor memory device according to claim 7, wherein a one-time deposition thickness of said layer of silicon oxide is substantially less than 20 Å and greater than 0 Å in order to diffuse silicon atoms within said layer of silicon oxide into said tantalum pentoxide film.

* * * * *